(12) United States Patent
Espiau de Lamaestre et al.

(10) Patent No.: US 8,541,791 B2
(45) Date of Patent: Sep. 24, 2013

(54) SOURCE OF PHOTONS RESULTING FROM A RECOMBINATION OF LOCALIZED EXCITONS

(75) Inventors: Roch Espiau de Lamaestre, Grenoble (FR); Jean-Jacques Greffet, Verrieres le Buisson (FR); Bernard Guillaumot, Le Fontanil (FR); Ruben Esteban Llorente, Madrid (ES)

(73) Assignees: STMicroelectronics (Grenoble) SAS, Grenoble (FR); Commissariat à l'Énergie Atomique et aux Énergies Alternatives Centre National de la Recherche Scientifique, Paris (FR)

( * ) Notice: Subject to any disclaimer, the term of this patent is extended or adjusted under 35 U.S.C. 154(b) by 317 days.

(21) Appl. No.: 12/968,507

(22) Filed: Dec. 15, 2010

(65) Prior Publication Data
US 2011/0204323 A1    Aug. 25, 2011

(30) Foreign Application Priority Data

Dec. 15, 2009    (FR) ...................................... 09 59007

(51) Int. Cl.
*H01L 27/15* (2006.01)
(52) U.S. Cl.
USPC .................. 257/87; 257/13; 257/E33.008
(58) Field of Classification Search
USPC ........... 257/13, 40, 86, 87, E33.008, E33.053
See application file for complete search history.

(56) References Cited

U.S. PATENT DOCUMENTS

| | | | |
|---|---|---|---|
| 4,882,295 A | 11/1989 | Czubatyj et al. | |
| 5,198,379 A * | 3/1993 | Adan | 438/151 |
| 7,132,319 B2 * | 11/2006 | Hoffman | 438/161 |
| RE40,485 E * | 9/2008 | Hori et al. | 257/79 |
| 7,683,392 B2 * | 3/2010 | Kawaguchi | 257/97 |
| 7,863,628 B2 * | 1/2011 | Choi et al. | 257/86 |
| 2005/0247924 A1 | 11/2005 | Atwater et al. | |
| 2005/0282317 A1 * | 12/2005 | Ikeda | 438/149 |
| 2006/0208251 A1 * | 9/2006 | Yoshizawa | 257/40 |
| 2009/0008628 A1 * | 1/2009 | Choi et al. | 257/13 |
| 2009/0102751 A1 * | 4/2009 | Takatoku | 345/55 |
| 2009/0243010 A1 * | 10/2009 | Nishikawa et al. | 257/431 |
| 2011/0089426 A1 * | 4/2011 | Kato | 257/66 |
| 2011/0193834 A1 * | 8/2011 | Nathan et al. | 345/204 |
| 2012/0032140 A1 * | 2/2012 | Li et al. | 257/13 |

OTHER PUBLICATIONS

French Search Report dated Aug. 12, 2010 from corresponding French Application No. 09/59007.
Manolatou, C. et al., *Subwave length Nanopatch cavities for Semiconductor Plasmon Lasers*, IEEE Journal of Quantum Electronics, IEEE Service Center, Piscataway, NJ, vol. 44, No. 5, May 1, 2008, pp. 435-447, XP011205181.

* cited by examiner

*Primary Examiner* — Matthew Landau
*Assistant Examiner* — Joseph C Nicely
(74) *Attorney, Agent, or Firm* — Wolf, Greenfield & Sacks, P.C.

(57) ABSTRACT

A source of photons resulting from a recombination of localized excitons, including a semiconductor layer having a central portion surrounded with heavily-doped regions; above said central portion, a layer portion containing elements capable of being activated by excitons, coated with a first metallization; and under the semiconductor layer, a second metallization of greater extension than the first metallization. The distance between the first and second metallizations is on the order of from 10 to 60 nm; and the lateral extension of the first metallization is on the order of from $\lambda 0/10{*}n_e$ to $\lambda 0/2{*}n_e$, where $\lambda 0$ is the wavelength in vacuum of the emitted light and $n_e$ is the effective refractive index of the mode formed in the cavity created by the two metallizations.

9 Claims, 3 Drawing Sheets

SOURCE OF PHOTONS RESULTING FROM A RECOMBINATION OF LOCALIZED EXCITONS

CROSS REFERENCE TO RELATED APPLICATIONS

This application claims the priority benefit of French patent application Ser. No. 09/59007, filed on Dec. 15, 2009, entitled "Source Of Photons Resulting From A Recombination Of Localized Excitons," which is hereby incorporated by reference to the maximum extent allowable by law.

BACKGROUND OF THE INVENTION

1. Field of the Invention

The present invention relates to photon sources comprising at least one emitter capable of being directly or indirectly excited, and thus of emitting a radiation, by successive injection of carriers having opposite polarities (to form on or several localized excitons). Such photon sources include photon sources with quantum boxes such as those comprising nanocrystals in an insulating layer.

2. Discussion of the Related Art

An article by Robert J. Walters et al. entitled "Silicon Nanocrystal Field-Effect Light-Emitting Devices", published in IEEE Journal of Selected Topics In Quantum Electronics, vol. 12, No 6, November-December 2006, pp. 1697-1656, discloses a light-emitting device with silicon nanocrystals such as illustrated in FIG. 1. This device comprises, on a solid P-type silicon substrate 1, a gate comprising a gate insulator layer 3 incorporating silicon nanocrystals 4. This gate insulator is topped with a polysilicon gate electrode 6 capable of being set to a voltage Vg. Heavily-doped N$^+$-type source and drain regions 7 and 8 are arranged on either side of the gate to form a structure which resembles that of a conventional N-channel MOS field-effect transistor (nMOSFET). In operation, in a first state, the source and the drain are biased so that the component is conductive and electrons are injected via the channel by tunnel effect into nanocrystals 4. In a second state, the source and the drain are set to the same voltage and holes are injected by tunnel effect from the substrate into the nanocrystals. Once they have received an electron and a hole, the nanocrystals emit light.

This light source has a very low intensity, first, basically, because silicon nanocrystals are low-efficiency emitters, and second because the light once emitted needs to cross the gate polysilicon before exiting towards the outside.

An article by Christina Manolatou et al. entitled "Sub-wavelength Nanopatch Cavities for Semiconductor Plasmon Lasers", IEEE Journal of Quantum Electronics, vol. 4, No 5, May 2008, pp. 435-447, describes another type of diode-type structure containing a light-emitting medium of type III-V (and not nanocrystals forming quantum boxes). In this article, the authors study the operation of a light-emitting PIN diode inserted in a structure of patch antenna type. This structure is illustrated in FIG. 2. A substrate 11 supports a first metal electrode 12 topped with a PIN diode comprising an N layer 13, an intrinsic layer 14, and a P layer 15, the assembly being topped with another metal electrode 17. The assembly of the two electrodes forms a patch antenna type structure. The article demonstrates that this structure has, when the diode is emitting, the characteristics of a patch antenna and provides a directional radiation. In all the given examples, the PIN layer assembly has a thickness approximately ranging from 140 to 240 nm. Further, the thickness of metal electrode 17 is on the order of 100 nm, which makes it strongly opaque to photons.

Thus, the resonant cavity formed between the two metal electrodes has a height (a thickness) on the order of half the wavelength (in the medium present between the two electrodes) of the emitted light. This cavity has a very high finesse, on the order of 200, that is, the source will emit in a very small wavelength range. For example, considering a central wavelength of 800 nm, the cavity may emit within a wavelength range from 796 to 804 nm.

An advantage of such a structure, incorporating a patch antenna type system, is that the outgoing light does not have to cross the upper layers of the photodiode, but exits laterally, to form, under the effect of the antenna, a directional beam.

A disadvantage of the patch antenna type structure provided in C. Manolatou et al.'s article is that, at first sight, it is not suitable to enhance the emission of a structure of the type comprising quantum boxes, given that (1) light source emitter(s) in a quantum box type structure inevitably have different dimensions and generate light within a relatively wide spectral band, for example, from 600 to 1,000 nm in the case of silicon nanocrystals, and that (2) the electromagnetic field concentration is low within the cavity. Thus, only a small number of emitters might be active, and the efficiency of their emission would be low.

SUMMARY OF THE INVENTION

An object of an embodiment of the present invention is to overcome at least some of the disadvantages of conventional quantum box structures, and especially to increase the emission efficiency and to avoid that the emitted light needs to cross an absorbing gate electrode before being emitted to the outside.

Another object of an embodiment of the present invention is to provide methods for manufacturing a light-emitting structure with quantum boxes compatible with CMOS-type technologies.

Thus, an embodiment of the present invention provides a source of photons resulting from a recombination of localized excitons, comprising a semiconductor layer having a central portion surrounded with heavily-doped regions; above said central portion, a layer portion containing elements capable of being activated by excitons, coated with a first metallization; and under the semiconductor layer, a second metallization of greater extension than the first metallization. The distance between the first and second metallizations is on the order of from 10 to 60 nm; and the lateral extension of the first metallization is on the order of from $\lambda 0/10*n_e$ to $\lambda 0/2*n_e$, where $\lambda 0$ is the wavelength in vacuum of the emitted light and $n_e$ is the effective index of the mode formed in the cavity created by the two metallizations.

According to an embodiment of the present invention, the lateral extension of the second metallization is on the order of from $\lambda 0/10*n_e$ to $10*\lambda 0/n_e$.

According to an embodiment of the present invention, the photon source is of the type comprising quantum boxes.

According to an embodiment of the present invention, the central portion has a doping level lower than $10^{19}$ at./cm$^3$ and is surrounded with more heavily-doped regions of opposite conductivity types.

According to an embodiment of the present invention, the semiconductor layer is a silicon layer.

According to an embodiment of the present invention, the total thickness of the layers present between the two electrodes ranges from 10 to 30 nm.

According to an embodiment of the present invention, the quantum boxes are silicon nanocrystals.

According to an embodiment of the present invention, the lateral extension of the first metallization is on the order of from 50 to 300 nm.

According to an embodiment of the present invention, the photon source comprises first connection means connected to the second electrode and to the first and second heavily-doped regions; and second connection means connected to the first electrode.

An embodiment of the present invention provides a method for manufacturing a photon source comprising the steps of:

forming above the upper layer of an SOI-type structure a gate stack comprising a region containing quantum boxes and a metal electrode;

implanting heavily-doped N$^+$ and P$^+$-type regions on either side of the gate;

flipping over the structure and forming a second electrode metallization;

flipping back the structure and forming connections towards each of the first metallization, of the second metallization, and of the two heavily-doped regions.

According to an embodiment of the present invention, the metallizations are made of copper or of aluminum.

The foregoing and other objects, features, and advantages of the present invention will be discussed in detail in the following non-limiting description of specific embodiments in connection with the accompanying drawings.

DETAILED DESCRIPTION

As usual in the representation of integrated circuits, the various drawings are not to scale, the dimensions of certain layers having been arbitrarily expanded for a better readability.

Figure 3:
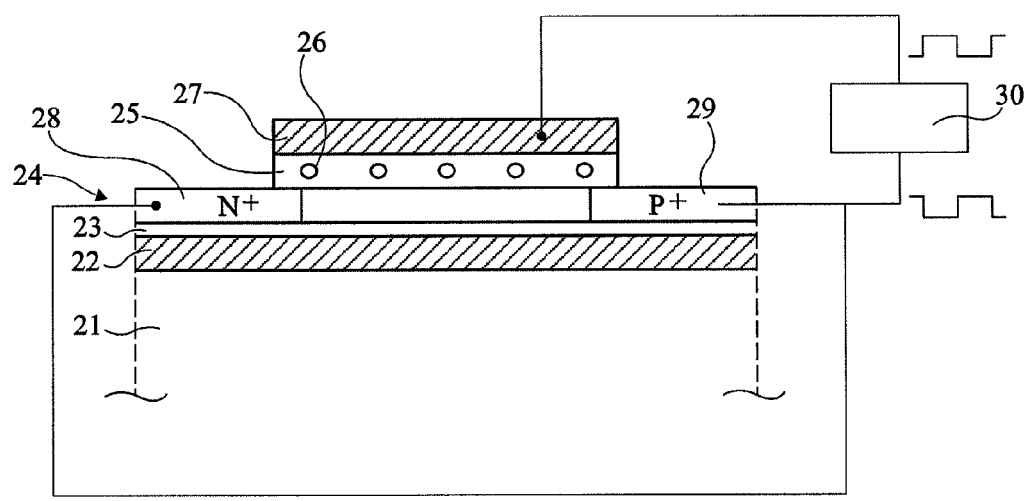
FIG. 3 is a cross-section view illustrating a structure according to an embodiment of the present invention.

As illustrated in FIG. 3, and embodiment of the structure provided herein comprises, on a substrate 21, a first metal electrode 22 topped with an optional insulating layer 23 above which a semiconductor layer 24 is formed. On the central portion of semiconductor layer 24 is formed a layer portion made of an insulating material 25 in which nanocrystals 26 forming quantum boxes are present. Layer 25 may also be made of a semiconductor material with a larger bandgap than that of the material of semiconductor layer 24 (it will be spoken of a wide bandgap semiconductor material). Layer 25 is topped with a second metal electrode 27. Implantations are formed on either side of the gate to form, to the left of the drawings, a heavily-doped N-type region 28 (N$^+$) and, to the right, a heavily-doped P-type region 29 (P$^+$). Preferably, as illustrated, heavily-doped regions 28 and 29 partially extend under layer 25 and metal electrode 27, typically by 5 nm, to ease the injection of carriers and thus increase the amount of generated light.

Layers 23, 24, 25 are extremely thin, so that the thickness between the two metal electrodes is on the order of from 10 to 60 nm, and preferably from 10 to 30 nm. Thus, this thickness is much lower than half the wavelength (in the medium comprising all the materials present between the two electrodes) of the light capable of being emitted by the nanocrystals. This low thickness enables concentrating the electromagnetic field at the level of the emitters placed in layer 25, and accordingly to enhance their emission. The field concentration obtained by the structure is much greater than that reached in a vertical Fabry-Perot cavity.

Upper electrode 27 is also very thin (typically on the order of a few tens of nanometers), which enables it to behave as a radiating current sheet when the emitter is placed nearby.

However, the lateral extension of upper electrode 27 is on the order of half the wavelength (or a multiple thereof) in the considered material ($\lambda 0/2*n_e$), where $\lambda 0$ is the wavelength in vacuum of the emitted light and $n_e$ is the effective index for layers 23 to 25 altogether.

Thus, in the device of FIG. 3, there is no vertical Fabry-Perot type resonant cavity, but a cavity structure resonating mainly in a horizontal direction due to the coupling of the close electromagnetic fields in the vicinity of the opposite metal electrodes. Lower electrode 22 has a lateral extension greater than that of upper element 27.

Electrodes 22, 27 altogether provide a structure of patch antenna type and the beam emitted by the nanocrystals will be directed with a given directivity, in one or two lobes, similarly to what occurs in patch-type microwave antennas. This directivity may be adjusted, in particular by the lateral size of electrodes 22 and 27.

Due to the fact that there is no vertical Fabry-Perot type resonant cavity between the two metallizations and that electromagnetic modes exhibiting a non-negligible electromagnetic field in the metal of electrodes 22 and 27 are used, the quality factor of the cavity will be relatively low, on the order of from 3 to 10 according to the experiments and simulations carried out by the present inventors. Therefore, it may be emitted over a relatively wide wavelength range, for example approximately ranging from 600 to 1,000 nm, more currently from 700 to 900 nm.

Thus, the structure described herein provides the advantages of a patch antenna structure in which light is actually extracted and redirected due to the shape of the antenna.

It should be noted that the embodiment described herein does not correspond to a conventional MOSFET structure and that regions 28 and 29 arranged on either side of the gate are of opposite conductivity types. Lower electrode 22 and regions 28 and 29 are connected to a first terminal of a square wave power source 30, while the gate (second electrode 27) is connected to the other electrode of power supply 30. If the biasing of the two electrodes is alternately varied, electrons and holes will alternately be injected, respectively from the N$^+$ region and from the P$^+$ region.

Figure 1:
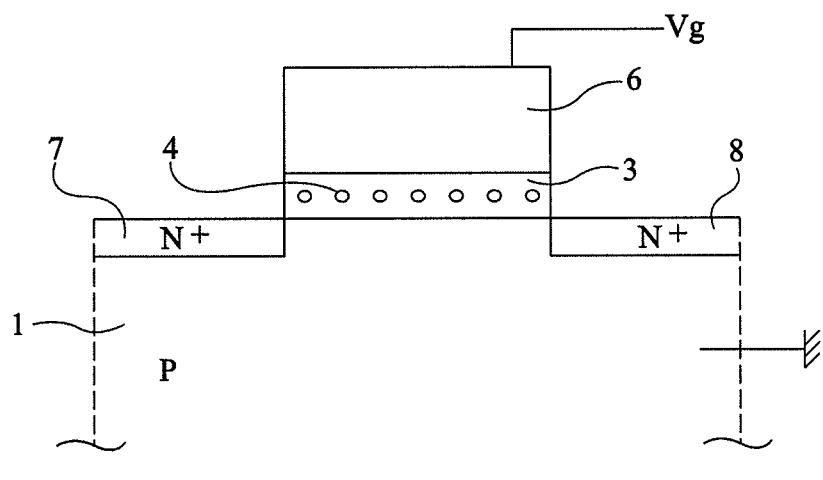
FIG. 1 is a cross-section view illustrating a structure such as described in the above-mentioned article by Walters et al.
Figure 2:
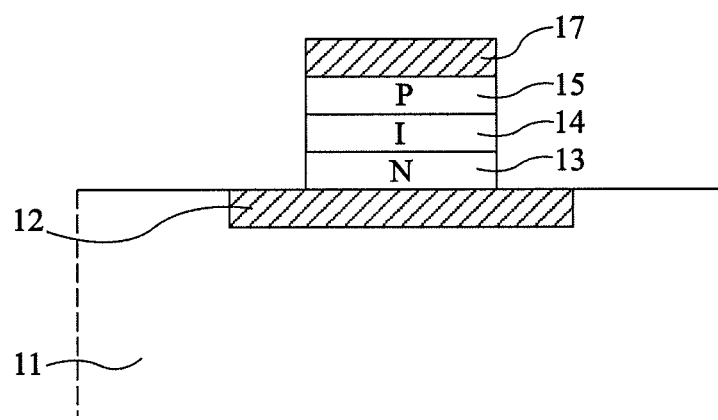
FIG. 2 is a cross-section view illustrating a structure such as described in the above-mentioned article by Manolatou et al.

Although the embodiment illustrated in FIG. 3 and described hereabove is a preferred embodiment, and even though this may seem to be less efficient than the injection of carriers, a MOSFET-type structure such as that illustrated in FIG. 1 may also be used, the electrons being provided by the drain and source regions and the holes being provided by the central region. In this case also, a partial penetration of the heavily-doped regions (of the same conductivity type) under the gate will preferably be provided. Although this is less efficient in terms of electric injection, a structure may also be used in which the electrons are provided by a heavily-doped N region (N$^+$) and the holes are provided by a P-type doped region partially covered by electrode 27. A partial penetration of the N$^+$ region under gate 27 will here also be provided.

Desirably, the emitters (nanocrystals or quantum blocks 26) will be arranged closer to semiconductor layer 24 than to upper gate 27, to ease the injection of carriers into such quantum boxes by tunnel effect and limit leakage currents into electrode 27.

The structure described herein especially has the following advantages:
- an emitted power greater than that of a structure of the type in FIG. 1, adjustable by the thickness of the cavity and the electric pumping frequency,
- a wide spectral band of the photonic cavity,
- the use of a patch-type antenna to control the electric injection, to enhance the electromagnetic field and to control the directivity of the emission,
- a technology compatible with CMOS manufacturing techniques, and
- the possibility of using a low injection voltage due to the $P^+$-$N^+$ structure used.

Manufacturing Method Example

FIGS. 4A to 4D illustrate steps of a possible method for manufacturing a structure according to the present invention. This example is an aspect of the present invention but should not be considered as limiting, and other methods can be envisaged to obtain the structure described in relation with FIG. 3.

In FIGS. 4A to 4D, the same references as those used in relation with FIG. 3 have been used for the layer portions corresponding to the final structure.

Figure 4A:
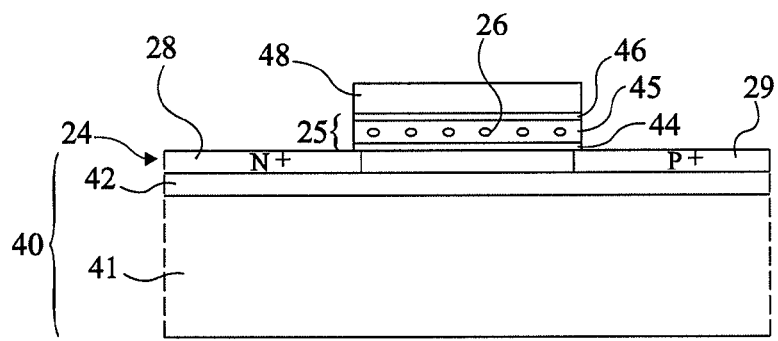
FIGS. 4A to 4D are simplified cross-section views illustrating successive steps of an embodiment according to the present invention of a structure such as described herein.

FIG. 4A shows the structure at an intermediary manufacturing step. It is started from an SOI-type substrate 40, comprising a silicon wafer 41, an insulating layer 42, and a semiconductor layer 24 having a doping lower than $10^{19}$ at./cm³ preferably having a thickness on the order of 10 nm. $N^+$ and $P^+$ regions 28 and 29 more heavily doped than layer 24 are formed by implantation in semiconductor layer 24, after forming of an insulated gate. This gate for example comprises a very thin layer (a few nm) of an insulating material 44, currently silicon oxide, an insulating layer 45 containing silicon nanocrystals 26, for example having a thickness ranging from 5 to 10 nm, and an insulating layer 46 for example having a thickness ranging from 5 to 10 nm. Layers 44, 45, and 46 altogether form previously-described layer 25. The gate is coated with a sacrificial layer 48, for example, made of polysilicon.

Figure 4B:
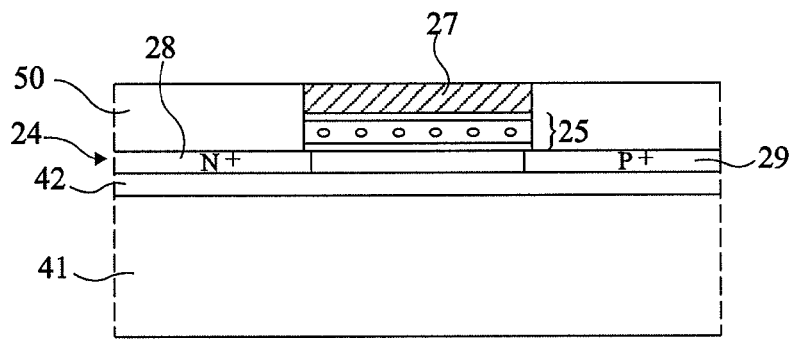

At a subsequent manufacturing step shown in FIG. 4B, the structure has been coated with an insulating layer 50, planarized until polysilicon layer 48 is exposed. This polysilicon layer has been removed by selective etching and replaced according to a damascene method with a layer of a metal, such as copper or aluminum, which will form previously-described second electrode 27.

Figure 4C:
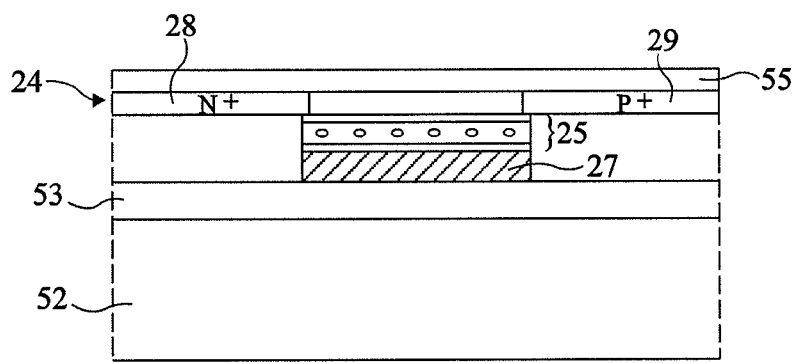

Finally, as illustrated in FIG. 4C, the structure is flipped over and glued to a handle 52, for example, a silicon wafer, with an interposed oxide layer 53. The upper surface of the structure is covered with an insulating layer 55. This insulating layer 55 may correspond to a portion of the thickness of oxide layer 42 of the initial SOI structure.

Figure 4D:
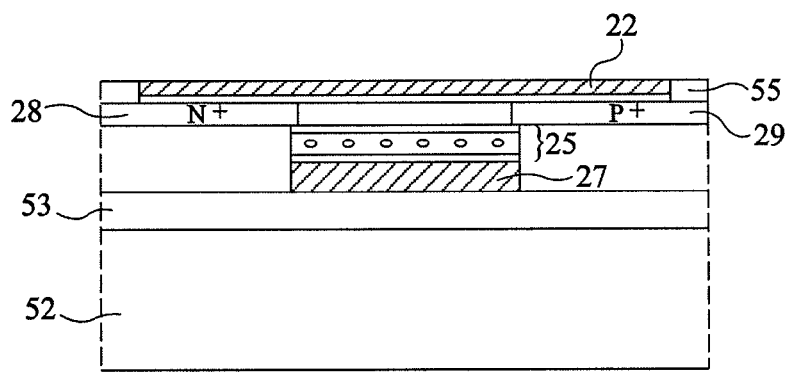

At the step illustrated in FIG. 4D, upper oxide layer 55 has been excavated into, and the excavated portion has been filled by a damascene method with a metal such as copper or aluminum, to form first electrode 22 of the structure of FIG. 3.

After this, the structure may be flipped back, attached to a handle (a silicon wafer), first handle 52 may be removed, and contacts to first electrode 22, second electrode 27, and $N^+$ and $P^+$ regions 28 and 29 may be created.

Of course, the present invention is likely to have various alterations, modifications, and improvements which will readily occur to those skilled in the art, especially regarding the manufacturing method and the materials forming the various insulating and metal layers as well as the use of various etch stop layers and of various diffusion barrier layers. Further, although a silicon semiconductor layer 24 has been described, it should be understood that any other semiconductor material may be used, provided that its bandgap is smaller than that of layer 25.

Embodiments of the present invention have been described in the case of quantum box structures formed of silicon nanocrystals embedded in an insulating layer. Other types of nanocrystals may be used, for example, nanocrystals of CdS, CdSe, CdTe, PbS, PbSe, PbTe, Ge and of III-V materials (AsGa, InGaAs, InAs, GaSb, InSb . . . ). Semiconductor islands obtained by growth on detuned semiconductor substrates, like islands of III-V material such as GaN on an AlN substrate, InAs on a GaAs substrate, InAs on a InP substrate . . . may also be used. The nature and the size of the quantum boxes will determine the emission wavelength and thus the sizing of the structure.

More generally, the present invention applies to any structure in which an electrostatic potential singularity creates an emitter capable of being directly or indirectly excited, and thus of emitting a radiation, by injection of carriers of opposite polarity types (forming of one or several excitons). This singularity may correspond to a crystallographic defect such as a gap in a crystal, for example, an F center in an alkali halide crystal (NaCl, KCl, NaBr, KBr). It may also be provided for the emission of light to originate from rare earths, for example, erbium comprised in an oxide by implantation or erbium or Yb in doped CdTe. Thus, the present invention relates to any source of photons resulting from a recombination of localized excitons.

Further, it should be noted that the described structure may advantageously form a so-called single-photon source capable of operating at high frequency (several megahertz).

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A source of photons resulting from a recombination of localized excitons, comprising:
    a semiconductor layer having a central portion surrounded with heavily-doped regions;
    above said central portion, a layer portion containing elements capable of being activated by excitons, coated with a first metallization; and
    under the semiconductor layer, a second metallization of greater extension than the first metallization;
    wherein:
    the distance between the first and second metallizations is on the order of from 10 to 60 nm; and
    the lateral extension of the first metallization is on the order of from $\lambda 0/10*n_e$ to $\lambda 0/2*n_e$, where $\lambda 0$ is the wavelength in vacuum of the emitted light and $n_e$ is the effective refractive index of the mode formed in the cavity created by the two metallizations.

2. The photon source of claim 1, wherein the lateral extension of the second metallization is on the order of from $\lambda 0/10*n_e$ to $10*\lambda 0/n_e$.

3. The photon source of claim 1, wherein the elements comprise quantum boxes.

4. The photon source of claim 3, wherein the quantum boxes are silicon nanocrystals.

5. The photon source of claim 4, wherein the lateral extension of the first metallization is on the order of from 50 to 300 nm.

6. The photon source of claim 1, wherein said central portion has a doping level lower than $10^{19}$ at./cm$^3$ and is surrounded with more heavily-doped regions of opposite conductivity types.

7. The photon source of claim 1, wherein the semiconductor layer is a silicon layer.

8. The photon source of claim 1, wherein the total thickness of the layers present between the two electrodes ranges from 10 to 30 nm.

9. The photon source of claim 1, comprising:
first connection means connected to the second electrode and to the first and second heavily-doped regions; and
second connection means connected to the first electrode.

* * * * *